United States Patent
Pileggi et al.

(10) Patent No.: US 9,524,767 B2
(45) Date of Patent: Dec. 20, 2016

(54) BITCELL WTH MAGNETIC SWITCHING ELEMENTS

(71) Applicant: CARNEGIE MELLON UNIVERSITY, Pittsburgh, PA (US)

(72) Inventors: Lawrence Pileggi, Pittsburgh, PA (US); David M. Bromberg, Pittsburgh, PA (US); Huseyin E. Sumbul, Pittsburgh, PA (US)

(73) Assignee: Carnegie Mellon University, Pittsburgh, PA (US)

( * ) Notice: Subject to any disclaimer, the term of this patent is extended or adjusted under 35 U.S.C. 154(b) by 0 days.

(21) Appl. No.: 14/898,580

(22) PCT Filed: Jun. 20, 2014

(86) PCT No.: PCT/US2014/043387
§ 371 (c)(1),
(2) Date: Dec. 15, 2015

(87) PCT Pub. No.: WO2014/205335
PCT Pub. Date: Dec. 24, 2014

(65) Prior Publication Data
US 2016/0125928 A1 May 5, 2016

Related U.S. Application Data

(60) Provisional application No. 61/957,006, filed on Jun. 21, 2013, provisional application No. 61/959,662, filed on Aug. 29, 2013.

(51) Int. Cl.
*G11C 11/00* (2006.01)
*G11C 11/16* (2006.01)
(52) U.S. Cl.
CPC .......... *G11C 11/1675* (2013.01); *G11C 11/161* (2013.01); *G11C 11/1673* (2013.01)

(58) Field of Classification Search
CPC .... G11C 11/56; G11C 11/5621; G11C 16/349; G11C 2029/0411; G11C 2029/4402; G11C 2211/5641; G11C 2211/5646; G11C 29/00; G11C 11/15; G11C 11/16; G11C 11/161; G11C 11/1675; G11C 11/5607
USPC ........................ 365/200, 201, 158, 171, 173, 230.03,365/185.29, 199, 225.5, 228, 49.11, 49.17, 50,365/63, 66
See application file for complete search history.

(56) References Cited

U.S. PATENT DOCUMENTS

| 6,903,964 B2 | 6/2005 | Nahas et al. |
| 7,577,017 B2 * | 8/2009 | Hung .................. G11C 11/5607 365/158 |
| 7,813,159 B2 | 10/2010 | Inaba | |

FOREIGN PATENT DOCUMENTS

WO    WO2014205335    12/2014

OTHER PUBLICATIONS

Int'l. Search Report and Written Opinion dated Nov. 6, 2014 for Int'l. Appln. No. PCT/US14/43387 (13 pgs.).

* cited by examiner

*Primary Examiner* — Thong Q Le
(74) *Attorney, Agent, or Firm* — Fish & Richardson P.C.

(57) ABSTRACT

A method includes receiving a data bit value at a buffer in a bitcell based on a first state of a write bitline connected to the buffer, and transferring the data bit value from the buffer to a first magnetic switching cell in the bitcell for a later read operation at least by holding the write bitline to a reference value different from the first state, and asserting first and second predetermined voltage levels on respective first and second write wordlines connected to the buffer.

29 Claims, 13 Drawing Sheets

BITCELL WITH MAGNETIC SWITCHING ELEMENTS

CLAIM OF PRIORITY

This application is a §371 National Stage Application of PCT/US2014/043387, filed Jun. 20, 2014, which, in turn, claims the benefit of priority under 35 U.S.C. §119(e) to provisional U.S. Patent Application No. 61/959,662, filed Aug. 29, 2013, and provisional U.S. Patent Application No. 61/957,006 filed Jun. 21, 2013. The entire contents of each of the prior-filed applications listed above are hereby incorporated by reference.

STATEMENT REGARDING FEDERALLY-SPONSORED RESEARCH AND DEVELOPMENT

This invention was made with partial government support under NSF Grants CCF1146799 and DGE 0750271, and IARPA Grant N6600112C2008. The government has certain rights in this invention.

FIELD OF THE INVENTION

The present disclosure relates to non-volatile memory devices, and in particular to memory devices with magnetic switching elements.

BACKGROUND OF THE INVENTION

Many applications today require large amounts of data to be stored and accessed quickly. Magnetic hard disk drives (HDDs) provide dense, non-volatile storage at low cost per bit, but the access times of these devices are intrinsically long, limited by the speed of the moving disk. Other storage components further up the memory hierarchy provide faster access times but at much lower density (e.g., on-chip cache). Aside from solid state memories such as Flash, these alternative technologies require a stable power supply for indefinite storage. And even the non-volatile memories such as flash have limited life cycles.

In the past ten years the search for a fast, non-volatile, dense memory technology has focused a spotlight on a non-volatile random access memory known as the magnetoresistive random access memory (MRAM).

In one approach, an MRAM can be based on a three-terminal memory element that can be switched by a phenomenon known as current-driven domain wall motion [see Fukami, et al., "Low-Current Perpendicular Domain Wall Motion Cell for Scalable High-Speed MRAM, 2009 Symposium on VLSI Technology Digest of Technical Papers, 2009]. This approach includes at least two CMOS access transistors, which can increase bitcell size, and also use non-optimal materials due to shared read- and write-paths.

SUMMARY OF THE INVENTION

In one aspect, a bitcell includes a first magnetic switching cell to receive a data bit, and a buffer comprising a second magnetic switching cell to receive a bitline value, wherein the bitline value is transferred from the buffer to the first magnetic switching cell as the data bit for a later read operation.

Implementations can include one or more of the following features. The bitcell can include a write bitline connected to the buffer for writing the bitline value to the buffer by asserting a predetermined write voltage level on the write bitline. The bitcell can include a write bitline connected to the buffer for writing the bitline value to the buffer by causing a current having a predetermined value and a predetermined direction to flow on the write bitline.

In some examples, the bitcell can include first and second write wordlines connected to the buffer. The first and second write wordlines can effect a transfer of the bitline value from the buffer to the first magnetic switching cell by asserting first and second predetermined voltage levels on the respective first and second write wordlines. For example, the first and second voltage levels can correspond to the first and second write wordlines. The first voltage level can include a first predetermined voltage level. The second voltage level can include a second predetermined voltage level. The first predetermined voltage level can include a polarity that is opposite to a polarity of the second predetermined voltage level.

The bitcell can include a read wordline connected to the first magnetic switching cell for reading the bitline value from the first magnetic switching cell by asserting a predetermined read voltage level on the read wordline. The bitcell can include a read bitline connected to the first magnetic switching cell for sensing a current passing through the first magnetic switching cell. The bitcell can include a read bitline connected to the first magnetic switching cell for sensing an impedance value of the first magnetic switching cell.

The buffer can include a third magnetic switching cell connected to the second magnetic switching cell. In some examples, the third magnetic switching cell can be switched in a different direction from that of the second switching magnetic cell in the buffer. The buffer can include a magnetic tunnel junction based device having a fixed resistance value and connected to the second magnetic switching cell. The buffer can include a resistive device connected to the second magnetic switching cell.

The resistive device includes a magnetic tunnel junction device. At least one of the first and second magnetic switching cells can be based on a selected one of a 1) spin-, or 2) spin-orbit, or 3) a combination of spin- and spin-orbit torque principle. At least one of the first and second magnetic switching cells can be based on a selected one of a 1) spin-transfer torque principle, 2) spin Hall effect, 3) Rashba effect, or 4) combination of spin-transfer torque principle, spin Hall effect, and Rashba effect.

An output of the buffer can be set to a predetermined ratio of two resistance values. A first write bitline connected to the buffer can be asserted to a first reference voltage, and first and second write wordlines can be asserted to predetermined first and second voltage levels, respectively, to cause a current to flow through a write-path of the first magnetic switching cell, a direction of the current determined by the predetermined ratio of the two resistance values.

The bitcell can include a circuit element for blocking current sneak paths in the bitcell, wherein the circuit element is a selected one of a) a diode, b) a capacitor, or c) a transistor. In some aspects, the bitcell can be a magnetic bitcell that is independent of a complementary metal-oxide-semiconductor (CMOS) device.

In another aspect, a memory device includes at least four bitcells arranged such that each bitcell shares one or more wordlines with another of the four bitcells, and shares one or more bitlines with yet another of the four bitcells. Each bitcell includes a first magnetic switching cell to receive a data bit, and a buffer comprising a second magnetic switching cell to receive a bitline value, wherein the bitline value is transferred from the buffer to the first magnetic switching cell as the data bit for a later read operation.

Implementations can include one or more of the following features. The memory device can include a sensing circuit connected to at least one of the four bitcells to detect the bitline value stored in the corresponding first magnetic switching cell of the bitcell at least by sensing a logical state of the bitcell. The memory device can include a sensing circuit that includes a third magnetic switching cell and one or more resistors in connection with the third magnetic switching cell. A write bitline can connect a first buffer of a first bitcell in series with a second buffer of a second bitcell within the memory device. The write bitline can connect magnetic switching cells of the first and second buffers in series such that a logical state of the write bitline is represented by a current flowing through write-paths of the first and second magnetic switching cells.

In another aspect, a bitcell includes a magnetic switching cell to receive a data bit, the magnetic switching cell including a programming path, and an evaluation path whose resistance can switch between a first resistance state and a second resistance state, the first resistance state being lower than the second resistance state, in response to signals magnetically coupled from the programming path, the programming path being electrically isolated from the evaluation path, and a buffer including at least a transistor to receive a bitline value, wherein the bitline value is transferred from the buffer to the magnetic switching cell as the data bit for a later read operation.

Implementations can include one or more of the following features. The magnetic switching cell can be based on a selected one of a 1) spin-, or 2) spin-orbit, or 3) a combination of spin- and spin-orbit torque principle. The magnetic switching cell can be based on a selected one of a 1) spin-transfer torque principle, 2) spin Hall effect, 3) Rashba effect, or 4) combination of spin-transfer torque principle, spin Hall effect, and Rashba effect.

In another aspect, a method includes receiving a data bit value at a buffer in a bitcell based on a first state of a write bitline connected to the buffer, and transferring the data bit value from the buffer to a first magnetic switching cell in the bitcell for a later read operation at least by holding the write bitline to a reference value different from the first state, and asserting first and second predetermined voltage levels on respective first and second write wordlines connected to the buffer.

Implementations can include one or more of the following features. Receiving a data bit value at a buffer includes storing the data bit value in a second magnetic switching cell in the buffer. The method can also include asserting a predetermined read voltage level on a read wordline connected to the first magnetic switching cell, and sensing a current passing through the first magnetic switching cell on a read bitline connected to the first magnetic switching cell.

Details of one or more implementations are set forth in the accompanying drawings and the description below. Other features, objects, and advantages will be apparent from the description, the drawings, and the claims.

DETAILED DESCRIPTION OF THE INVENTION

A non-volatile magnetic memory array, such as an MRAM, includes a plurality of memory elements called "bitcells." Each bitcell is capable of storing information in the form of a logical state, i.e., a state of "logical-1" or "logical-0" corresponding to a high or low resistance state of the bitcell, respectively. For example, an MRAM can be implemented by a device based on the magnetic tunnel junction (MTJ) phenomenon (called an MTJ device or element) in series with a complementary metal-oxide-semiconductor (CMOS) access transistor. A state of the bitcell can be written when a control signal to the CMOS transistor is high, which passes a large current through the MTJ element that switches its logic state from a high resistance to a low resistance (or vice versa) by a spin torque phenomenon (for example spin-transfer torque, or spin Hall effect, or a combination of the phenomenona). To perform a read operation, a smaller voltage can be applied to the transistor, which passes a sensing current through the MTJ to evaluate its resistance.

The present disclosure relates to a non-volatile magnetic memory in which each bitcell includes one or more magnetic elements called "mCells." An mCell is a four-terminal magnetic switching device (or cell). Construction and example operational details of an mCell are disclosed in, for example, U.S. Pat. No. 8,400,066, entitled "Magnetic Logic Circuits and Systems Incorporating Same," to inventors Lawrence T. Pileggi and Jian-Gang (Jimmy) Zhu, the disclosure of which is incorporated in its entirety herein.

As described in detail below, the mCell-based bitcell can include a first magnetic switching cell or a first mCell to receive and store a data bit (i.e., a "1" or a "0" representation). The value stored in the first mCell represents the state of the bitcell. A WRITE operation performed on the bitcell involves programming or storing the data bit into the first mCell. The bitcell includes a temporary storage element called a buffer. For example, the buffer includes a second magnetic switching cell or a second mCell coupled to a resistive device. The WRITE operation is performed on the bitcell in two steps. In a first step, the data bit is received from a write bitline (as described in detail below) and stored in the buffer (i.e., in the second mCell of the buffer). In a second step, the data bit is transferred from the buffer to the first mCell. A later READ operation can sense the value stored in the first magnetic switching cell to determine the data bit value.

Figure 1:
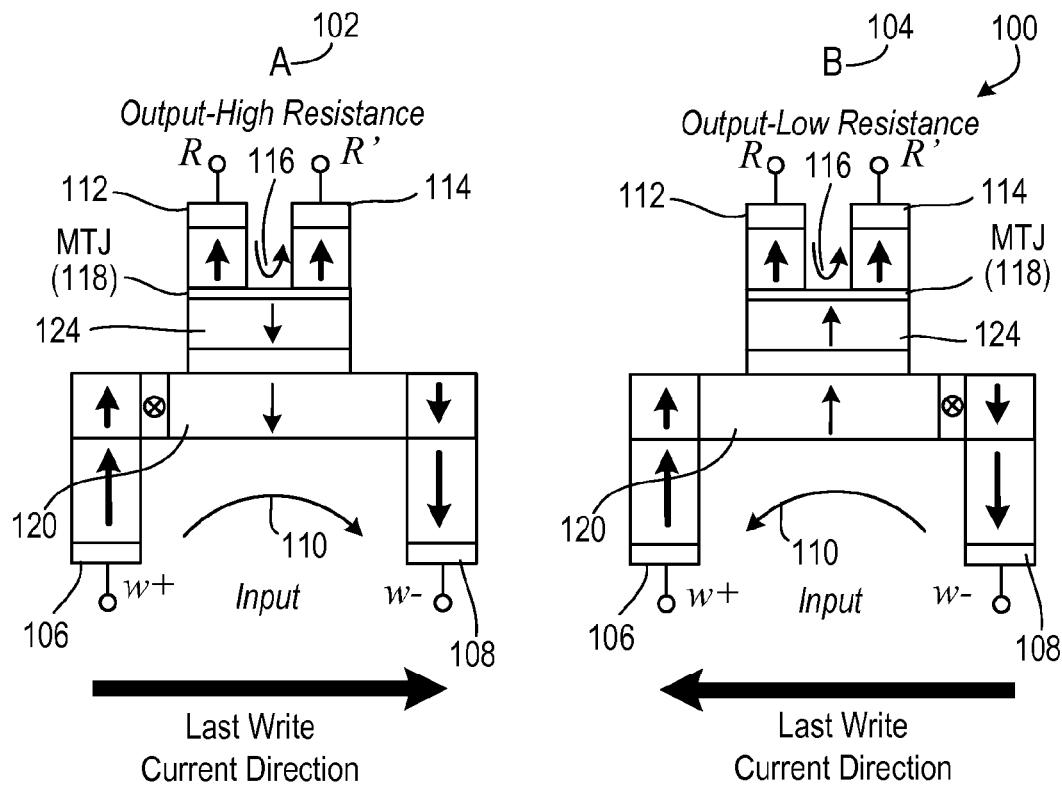
FIG. 1 shows schematic representation of states of a magnetic switching cell or an mCell.

FIG. 1 shows a cross-section of a magnetic switching cell or mCell 100 in two states 102 and 104. State 102 corresponds to a high resistance state of mCell 100 (which can be regarded, in some implementations, as a logical-1), while state 104 correspondences to a low resistance state (which can be regarded, in some implementations, as a logical-0). As shown, mCell 100 is a four-terminal device. mCell 100 includes two write terminals ($w^+$, $w^-$) 106, 108 that constitute a programming or write path 110, and two read terminals ($R^+$, $R^-$) 112, 114 that constitute an electrically-insulated, and magnetically-coupled evaluation or read path 116. The write path 110 is switched by pulsing a small current through its terminals 106, 108, which causes a resistance change through one or more MTJs 118 in the read path 116. Additional details about the magnetic switching cell 100 including its operational details can be found in, for example, U.S. Pat. No. 8,400,066.

As noted, mCell 100 has electrically isolated write and read paths 110, 116, and can have perpendicular, in-plane, or canted magnetization. mCell 100 can be switched based on current-driven domain wall motion, where the underlying phenomenon can be spin-transfer torque, the spin Hall effect, the Rashba effect, any other spin- or spin-orbit torque, including a combination of spin-transfer torque principle, spin Hall effect, and Rashba effect. In one implementation, the write terminals ($w^+$, $w^-$) 106, 108 are shown as fixed magnetic studs, which allow a domain wall to form in the write-path, as described in further detail below.

As noted above, the two current paths, i.e., the write path 110 and the read path 116, can be electrically isolated from each other. The write path 110 (also called a programming path) can be used to program mCell 100. The read path 116 (also called the evaluation or sensing path) can be used to evaluate or sense a state of mCell 100. The write terminals 106, 108 can be used to apply currents to switch mCell between a low and a high resistance state (and thereby to a logical-0 and a logical-1 state). The read or evaluation terminals 112, 114 can be used to detect a state (i.e. low or high resistance state) of mCell 100. For example, the read terminals 112, 114 can present a first low resistance when mCell 100 is in a low resistance state, and a second, high resistance when mCell 100 is in a high resistance state. For example, if mCell 100 is a magnetic switching cell or device that is approximately 20 nm in length and width, the terminal-to-terminal resistance of the read path 116 in a low resistance state can be 5000 Ω. For example, the terminal-to-terminal resistance of the read path 116 of such a device in a high resistance state can be approximately 15,000 Ω.

The application of a programming current from the positive write terminal 106 into mCell 100 and out of the negative write terminal 108 causes a domain wall movement within the write path 110 towards the positive write terminal 106. This results in mCell 100 entering the high resistance state 102 as follows. The flow of the programming current in the write path 110 causes a write domain switching portion 120 to become aligned with the magnetizations in the rest of the write path 110. The read path 116 is electrically isolated from the structures that make up the write path 110, but is magnetically coupled to the write domain switching portion 120 of the write path 110. As a result of the magnetic coupling, a read domain switching portion 124 in the read path 116 follows the magnetization of the write domain switching portion 120. The magnetizations of the write and read domain switching portions 120, 124 are therefore shown to be in the same direction (i.e., both downward). Because the magnetization of the read domain switching portion 124 is not aligned (i.e. antiparallel) with the magnetizations in the rest of the read path 116, the read path 116 presents a high resistance to the evaluation current. As a result, at this point, mCell 100 assumes the high resistance state 102. To read the high resistance state 102 of mCell 100, the resistance of the read path 116 is sensed by applying an evaluation current, which is different from the programming current, to the read terminals 112, 114.

Similarly, a current flowing from the negative write terminal 108 and out of the positive write terminal 106 can cause the domain wall to position itself proximate to the negative write terminal 108. This causes mCell 100 to assume the low resistance state 104. Accordingly, the magnetization of the read domain switching portion 124 is reversed and aligned (i.e. parallel) with the magnetizations in the rest of the read path 116. As such, the read path 116 presents a high resistance state 104 to the evaluation current.

Figure 2:
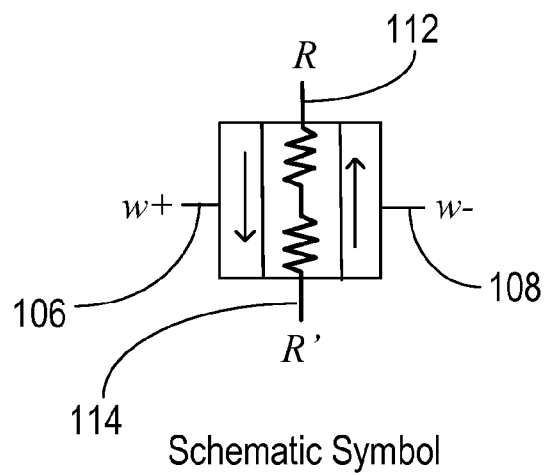
FIG. 2 illustrates a schematic symbol for an mCell.

FIG. 2 illustrates a schematic symbol 200 for mCell 100. As shown, the schematic symbol includes write terminals ($w^+$, $w^-$) 106, 108 marking a beginning and an end of the write path and read terminals ($R^+$, $R^-$) 112, 114 marking a beginning and an end of the read path of mCell 100.

Figure 3:
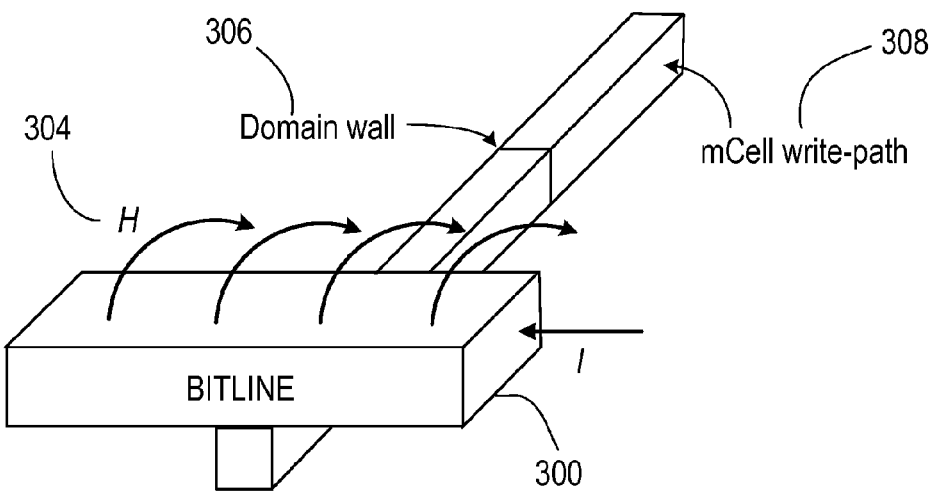
FIG. 3 illustrates the formation of a domain wall in an mCell write path.

In some implementations, a domain wall can be initialized with an applied field. Such an applied field can be established by passing a current through a neighboring wire, which can be, for example, a bitline, wordline, or ground rail in the context of a memory array. Referring to FIG. 3, a domain wall in a write path of an mCell (e.g., write path 110 of mCell 100 in FIG. 1) can be established by applying a magnetic field 304. As shown, a current passing through a neighboring wire 300, such as, a bitline, establishes the magnetic field 304. The magnetic field 304 causes a domain wall 306 to be formed in the mCell write path 308. In some examples, magnetic devices that are single-domain such that no domain wall is present can be used.

Figure 4:
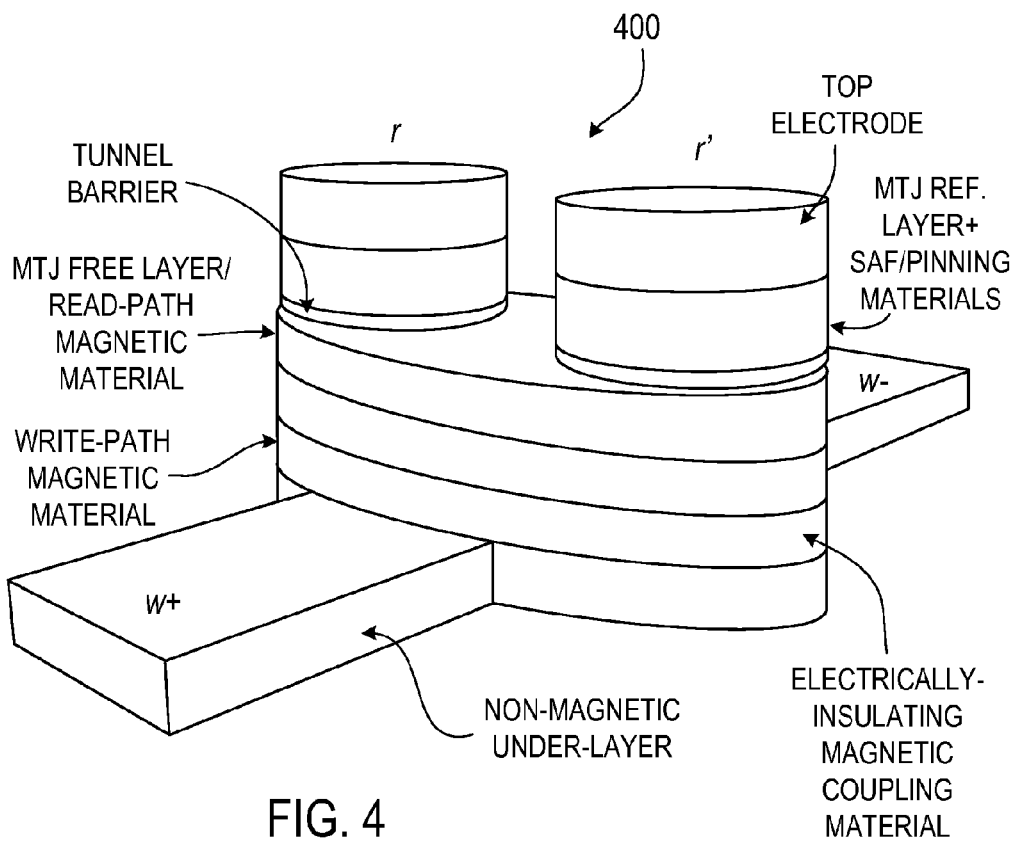
FIG. 4 shows a three dimensional view of an mCell that does not contain a domain wall and can be used for in-plane magnetization.
Figure 5:
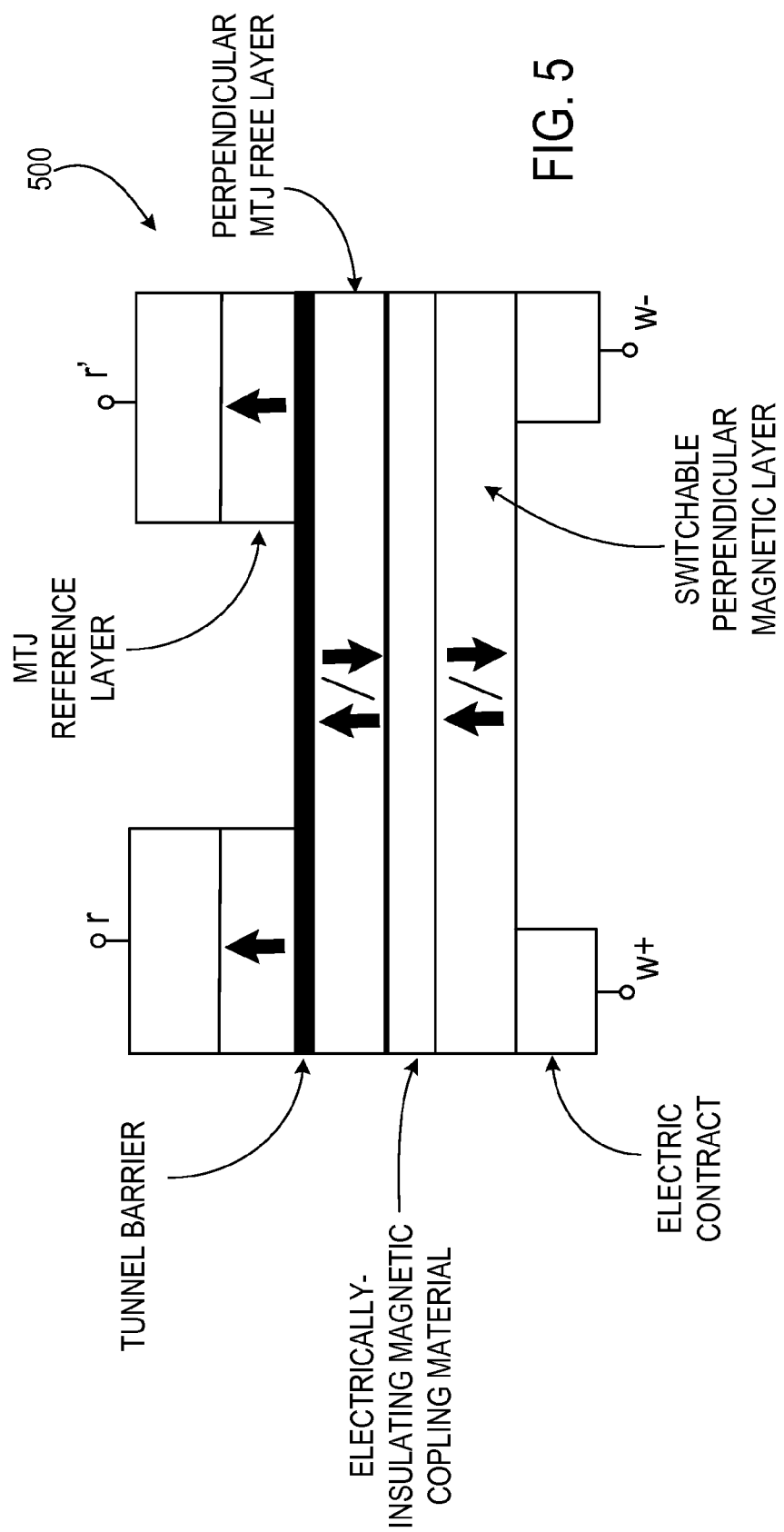
FIG. 5 shows a cross-section of an mCell that does not contain a domain wall and can be used for perpendicular magnetization.

FIGS. 4 and 5 show example mCell structures 400, 500 that can be used in some implementations. In these structures, the switching mechanism is a spin-orbit torque. Further details concerning these mCell structures can be found in, for example, co-pending PCT Application No. PCT/US2013/073073, entitled "A Nonvolatile Magnetic Logic Device," the disclosure of which is incorporated in its entirety herein.

An mCell can have high thermal stability, i.e., an ability to function at high temperatures. As such, mCells can be deeply-scaled and are also 3D-stackable, thereby making extremely high-density non-volatile memory possible. Since the magnetic elements that form the array of bitcells can be deposited on a CMOS chip but without requiring interconnections to the silicon substrate for each bitcell (only for the CMOS periphery circuits), the density can be extremely high and limited only by the scaling dimensions of the magnetic elements and the bitline and wordline interconnect lines. The memory is capable of doing multi-port operations due to the isolated read and write paths of the mCells (see, e.g., write and read paths 110, 116 of FIG. 1). In implementations, current-based signaling and all-magnetic bitcells also makes this memory technology immune to noise sources that plague traditional SRAM and DRAM. Current signaling also enables the voltage levels to be as small as 10's of millivolts, and avoids the significant power dissipation associated with charging and discharging capacitive circuit nodes during typical CMOS operation.

Figure 6:
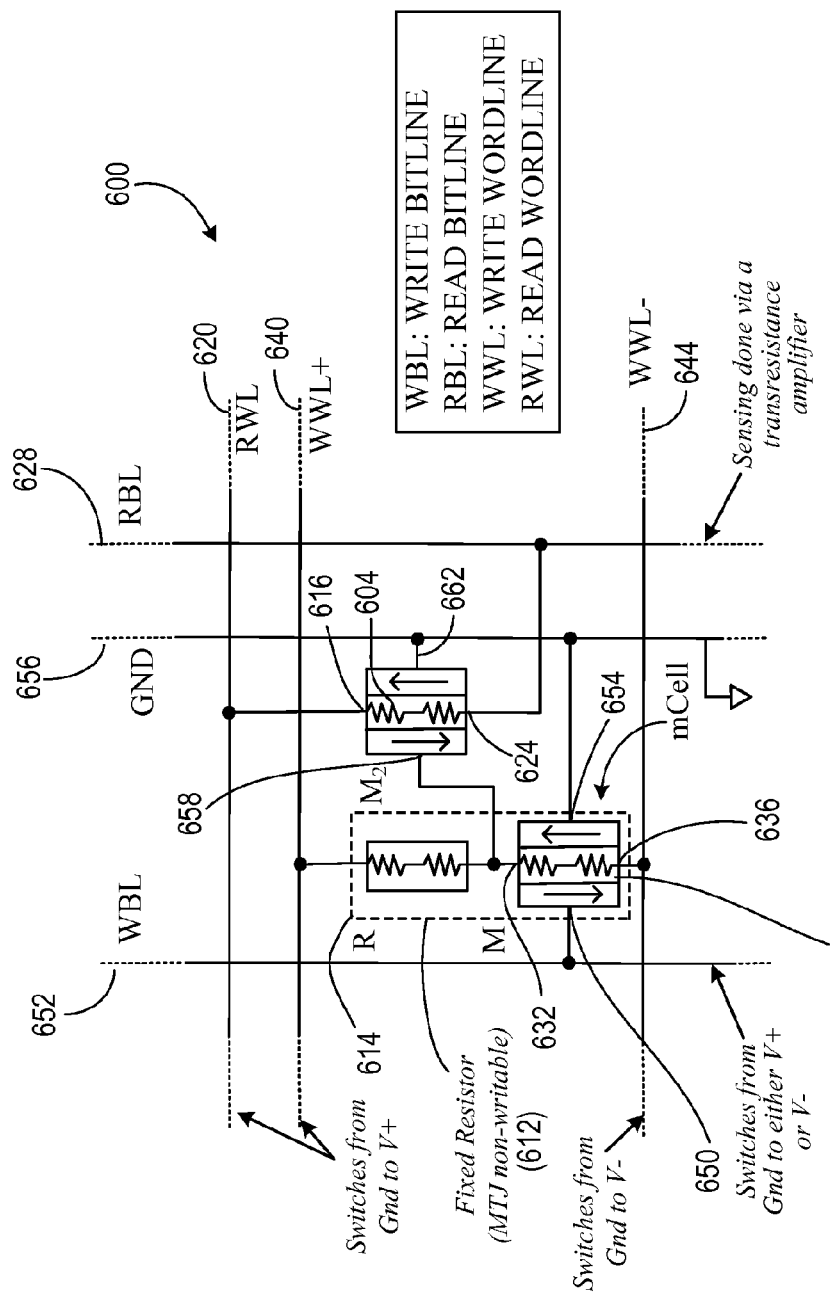
FIG. 6 shows an example bitcell consisting of two and one-half magnetic elements (one-half element being a fixed resistive device that matches the behavior of the magnetic tunnel junction (MTJ) resistance), with connections to wordlines and bitlines. This configuration is also applicable to a three mCell bitcell.

Referring to FIG. 6, in an implementation, a bitcell 600 consists of two mCells 604 and 608 and a resistive device 612. mCell 608 and resistive device 612 together constitute a scratch buffer 614. Scratch buffer 614 is similar to an example of an inverter described in, for example, U.S. Pat. No. 8,400,066.

The two mCells 604 and 608 perform different roles in bitcell 600. mCell 604 holds the data bit value that represents the state of bitcell 600. For example, if a state of bitcell 600 is represented to be "0", it is taken to mean that mCell 604 holds a data bit value of "0" (or, in some examples, is in a state of low resistance). Similarly, if a state of bitcell 600 is represented to be "1", it is taken to mean that mCell 604 holds a data bit value of "1" (or, in some examples, is in a state of high resistance). mCell 608, on the other hand, as part of buffer 614, temporarily holds the data bit value ("0" or "1") before transferring it to mCell 604. In some implementations, the buffer 614 operates as an inverter and holds an inverse of the data bit value.

A plurality of bitcells (including bitcell 600) can be arranged in series of rows and columns and can even be stacked on top of one another. As shown, mCells 604, 608 and resistive device 612 are connected to the rest of a memory array though a network of bitlines and wordlines. These bitlines and wordlines variously perform READ or WRITE operations on the bitcell 600. A first read terminal 616 of mCell 604 is connected to a read writeline (RWL) 620. A second read terminal 624 of mCell 604 is connected to a read bitline (RBL) 628, which in turn is connected to a sense amplifier (not shown). For example, the sense amplifier can be a transresistance or a transimpedance amplifier (TIA) that can sense an evaluation current to determine a state of mCell 604.

The mCell 608 has read terminals 632 and 636 that connect mCell 608 in series with resistive device 612. The buffer 614 (including mCell 608 and buffer 612) is connected to a first write wordline (WWL+) 640 on one end and a second write wordline (WWL−) 644 on another end. In addition, a first write terminal 650 of the second mCell 608 is connected to write bitline (WBL) 652. A second write terminal 654 of mCell 608 is connected to a ground line (GND) 656. In like manner, a first write terminal 658 of mCell 604 is connected to the first read terminal 632 of mCell 608. The second write terminal 662 is connected to the ground line (GND) 656.

In some implementations, the resistive device 612 in the buffer 614 can be a standard resistor. In some implementations, the resistive device 612 can be implemented with magnetic materials (e.g., a device that is based on the magnetic tunnel junction phenomenon and having a fixed resistance value). In some implementations, the resistive device 612 can be a third mCell that is operated as a resistive device. For example, the third mCell can be a non-switchable mCell.

Addressing first a WRITE operation, the write bitline (WBL) 652 is driven to either V+ or V−, depending on the data bit value being written. For example, if the data bit value is "1", then the write bitline (WBL) 652 is driven to V−; if the data bit value is "0" then the write bitline (WBL) 652 is driven to V−. This data bit value is stored in the buffer 614. In particular, the data bit value is stored in mCell 608 of the buffer 614. When the write bitline (WBL) 652 goes to either V+ or V−, a potential difference is created across the write terminals 650, 654 of mCell 608, leading to a certain directionality of current that programs the state of mCell 608 to either a logic-1 or logic-0 depending on the applied voltage on the write bitline (WBL) 652. For example, mCell 608 stores a data bit value of "1" by causing the read path magnetization to become anti-parallel and thus enter a state of high resistance (see FIG. 1). Similarly, mCell 608 stores a data bit value of "0" by causing the read path magnetization to become parallel and thus enter a state of low resistance.

In the manner described above, the buffer 614 captures the bitline logic value for each corresponding row in a memory array. Next, the bitline logic value is transferred to mCell 608. For the row(s) that will write the bitline value into mCell 604, the write bitline (WBL) 652, which was previously asserted to V+ or V−, is held at ground (GND) as the write wordlines WWL+ 640 and WWL− 644 are asserted to V+ and V−, respectively. This causes a current to flow through the write terminals 658, 662 of mCell 604, the directionality of which is determined by the ratio of the read path resistance of mCell 608 to the resistance of the resistive device 612.

In particular, current originates from the first write wordline (WWL+) 640 and flows through the resistive device 612. If the read path resistance of mCell 608 is high, then a net positive current from the write wordline (WWL+) 640 flows through resistive device 612 flows through the write terminals from 658 to 662 of mCell 604 to change the resistance of mCell 604. This resistance value of 604 represents the stored logic bit for the bitcell. On the other hand, if the read path resistance of mCell 608 is low, then a net current flows out of the write terminals 662, 658 of mCell 604 and towards the second write worldline (WWL−) 644 via the read path of mCell 608. This mechanism programs the bit value of mCell 604. The ratio of the read path resistance of mCell 608 to the resistance of the resistive device 612 steers the current in the bitcell 600 in a predetermined way (based on, e.g. a selected resistance value of the resistive device 612) so as to program the state of the mCell 604. The current flow through the write terminals 658, 662 of mCell 604 performs the function of programming the bitcell 600.

As previously noted (see, e.g. discussion in connection with FIG. 1), the state of storing a data bit value as a high or low resistance depends on a polarity (i.e. direction) of write current through the write inputs of e.g mCell 604 as it flows through write terminals 658 and 662. As noted, the polarity of the write current is determined by the resistance state of mCell 608 relative to the resistive device 612. In the example of FIG. 6, the mCell 604 is programmed to be in a state of low resistance. Similarly, if mCell 608 was in a low resistance state, then mCell 604 is programmed to be in a high resistance state. As noted above, mCell 604 thus holds the data value of the bitcell 600.

The write bitline (WBL) 652 need not be asserted to any particular predetermined state. So long as the write bitline (WBL) 652 was previously asserted, that previously asserted value is captured by the buffer 614 and stored in mCell 608. In this regard, the buffer is non-volatile, i.e., it is configured to capture and retain the last write bitline (WBL) 652 value for a subsequent operation.

To perform a READ operation, the write wordlines (WWL+) and (WWL−) 640, 644 are returned to GND, and the read wordline (RWL) 620 is asserted to V. As a result, an evaluation current flows through read terminals 616, 624 of mCell 604 and can be sensed on the read bitline (RBL) 628.

In some implementations, the scratch buffer can include two mCells whereby the pull-up fixed resistor can be replaced by an mCell that is programmed to switch in a direction that is opposite to the direction of mCell 608.

Figure 7:
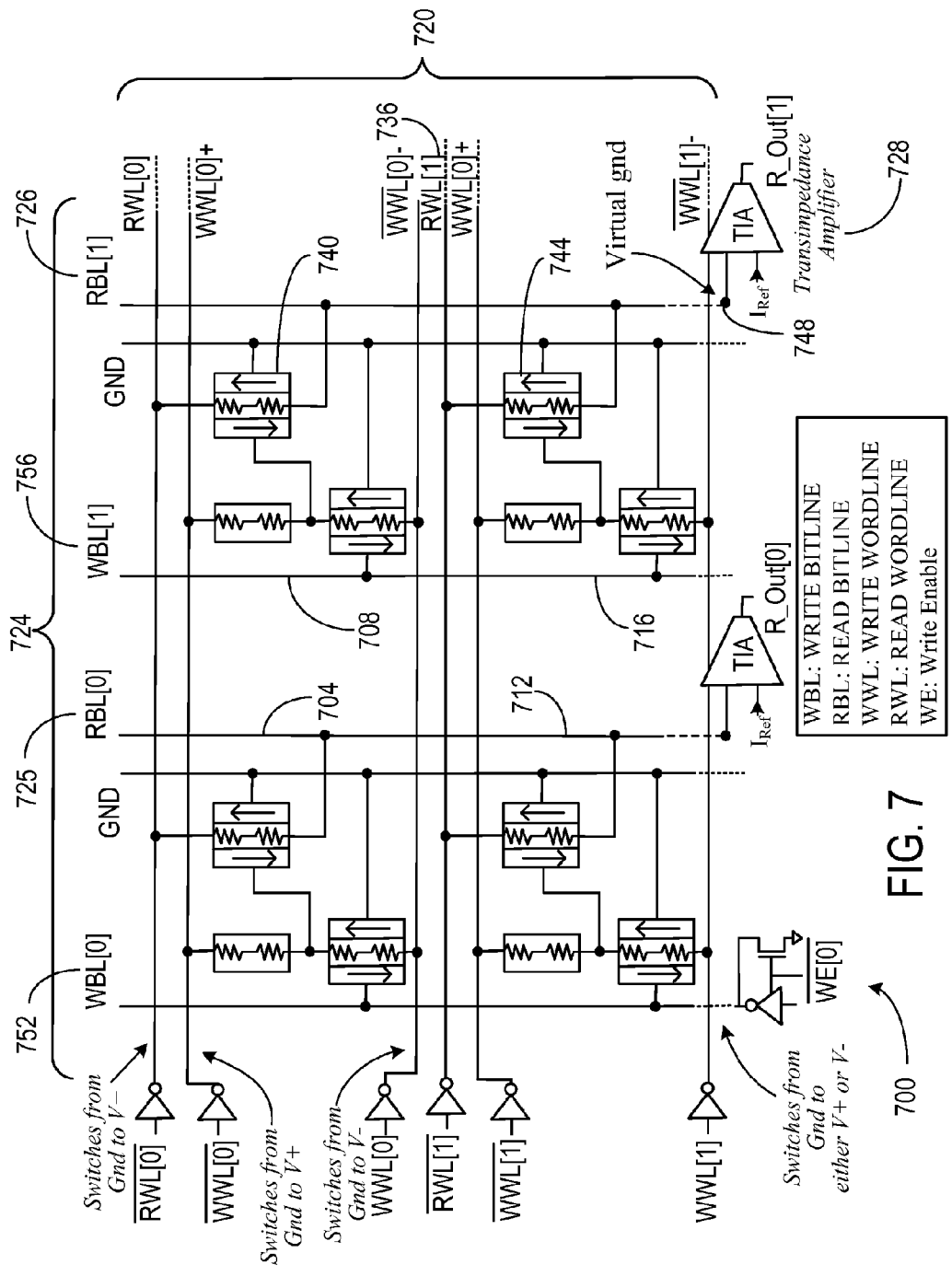
FIG. 7 shows a schematic diagram of a 2×2 exemplary memory array with certain periphery elements.

FIG. 7 shows an example 2×2 memory array 700 based on a plurality of bitcells 704-716 using magnetic elements (such as bitcell 600). Like conventional memory technologies such as dynamic random access memory (DRAM) and static random access memory (SRAM), the memory array is divided into rows and columns. Each row shares the same wordlines 720, and each column shares the same bitlines 724, allowing for addressing anywhere in the array 700. Each wordline 720 is connected to an inverter or buffer (not shown) that sets the line voltage to the required value (as indicated in the schematic and described in the previous paragraph in the context of one bitcell) when activated by the proper control signal (also indicated in the schematic).

During a READ operation, a high voltage is applied to the appropriate read wordline (RWL) (e.g., 732 or 736), causing a sensing current to flow through the mCell read path it is connected to (e.g., 740 or 744). The sensing current is conveyed on the read bitlines (RBL) 725, 726, which are connected to respective sensing transimpedance amplifiers (TIA) 728. The magnitude of the sensing current depends on the read path resistance (and therefore, the logic state) of the corresponding mCell 740, 744 and can be compared to a reference current at the sensing transimpedance amplifier (TIA) 728. The output of the TIA 728 indicates if mCells 740 or 744 are in high or low resistance states.

In some implementations, an input 748 of the TIA 728 through which the sensing current flows is held at virtual ground to prevent the current from "sneaking" into other devices in the array 700.

Figure 8:
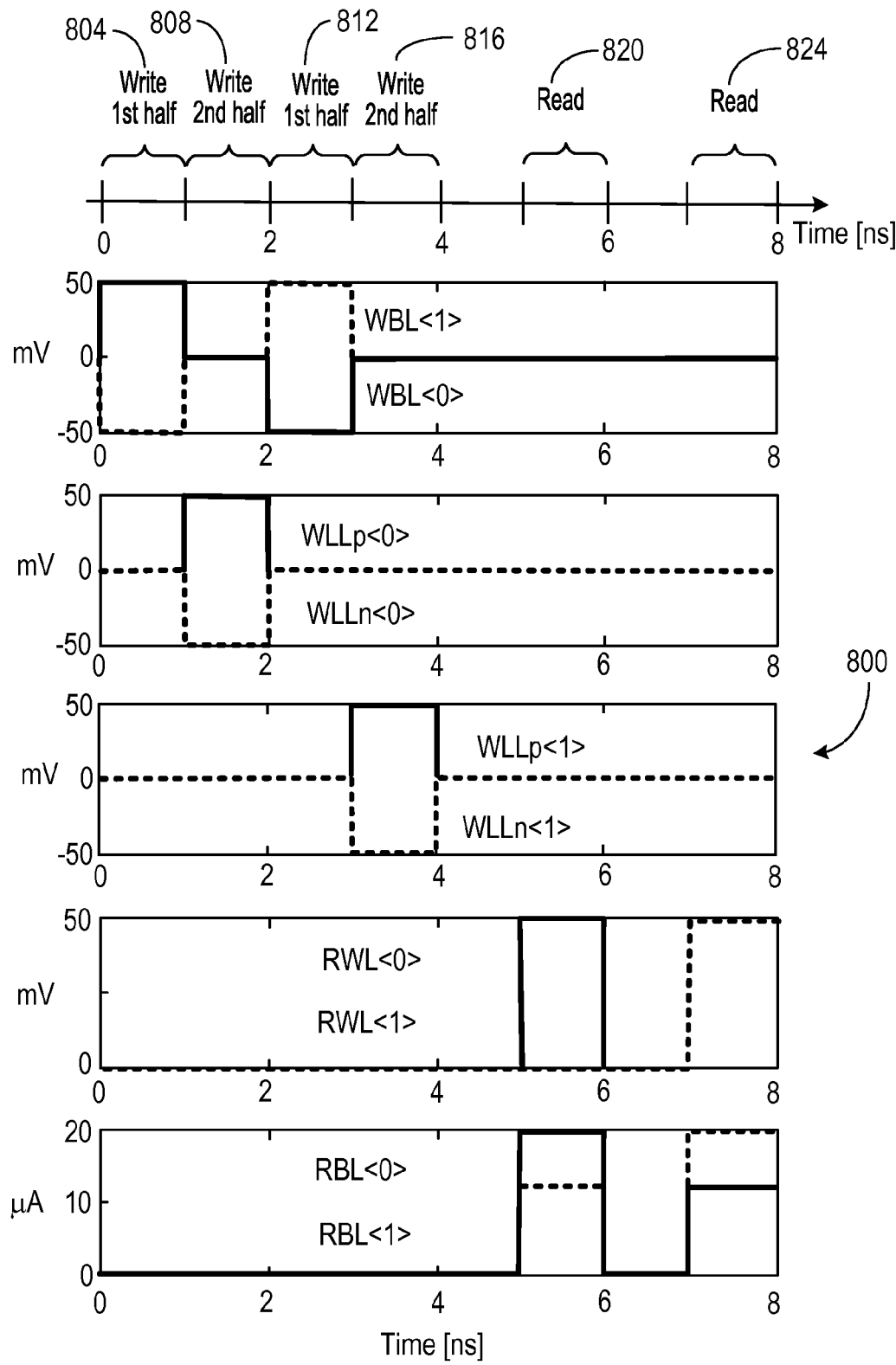
FIG. 8 shows a sample simulation of the 2×2 memory array.

FIG. 8 shows a sample simulation of the memory array 700. For example, the bit pattern "10" is written to the bitcells 704, 708 in a top row of the array 700 and "01" to the bitcells 712, 716 in a bottom row of the array 700.

During a first half cycle 804, WBL[0] 752 is asserted to +50 mV (corresponding to a logical-1), while WBL[1] 756 is asserted to −50 mV (corresponding to a logical-1). This causes the respective bitcell buffers to store the logical-1 and logical-0 states as discussed previously.

In the second half cycle 808, the WBL[0] 752 and WBL[1] 756 lines are held at 0 mV, while the pair of lines WWLp[0] and WWLn[0] (corresponding to WWL[0]+ and WWL[0]− in FIG. 7) are asserted to +50 mV and −50 mV, respectively. This causes the values held in the buffers of the bitcells 704, 708 in the top row of the array 700 to transfer to the storage mCell (e.g., mCell 740) of the respective bitcells 704, 708. At the same time, WWLp[1] and WWLn[1] (corresponding to WWL[1]+ and WWL[1]− in FIG. 7) are held at 0 mV, so that the values held in the buffers of the bitcells 712, 716 in the lower row of the array 700 are not transferred. At the end of the second half cycle 808, the top row bitcells 704, 708 hold the values "1" and "0". In a similar manner, during the next write first and second half cycles 812 and 816, the values "0" and "1" are written to the bitcells 712, 716 of the bottom row of the array 700.

As shown, during a first read cycle 820, RWL[0] 732 is asserted to read from the top row of the array 700. RBL[0] 725 returns a higher current than RBL[1] 726, indicating the pattern "10" is being read. In a second read cycle, 824, RWL[1] is asserted to read the bottom row of the array 700, and this time RBL[0] returns a smaller current than RBL[1], indicating the pattern "01" is being read.

In some implementations, entire words (rows) can be written to or read from at the same time. In some examples, other circuitry can be placed in the periphery (i.e., not in the array itself) to allow for access to individual cells or clusters of cells within a row. Because the read- and write-paths of the mCells are electrically-isolated, the bitcells allow multi-port access such that read and write operations can be completed in a same cycle.

Figure 9:
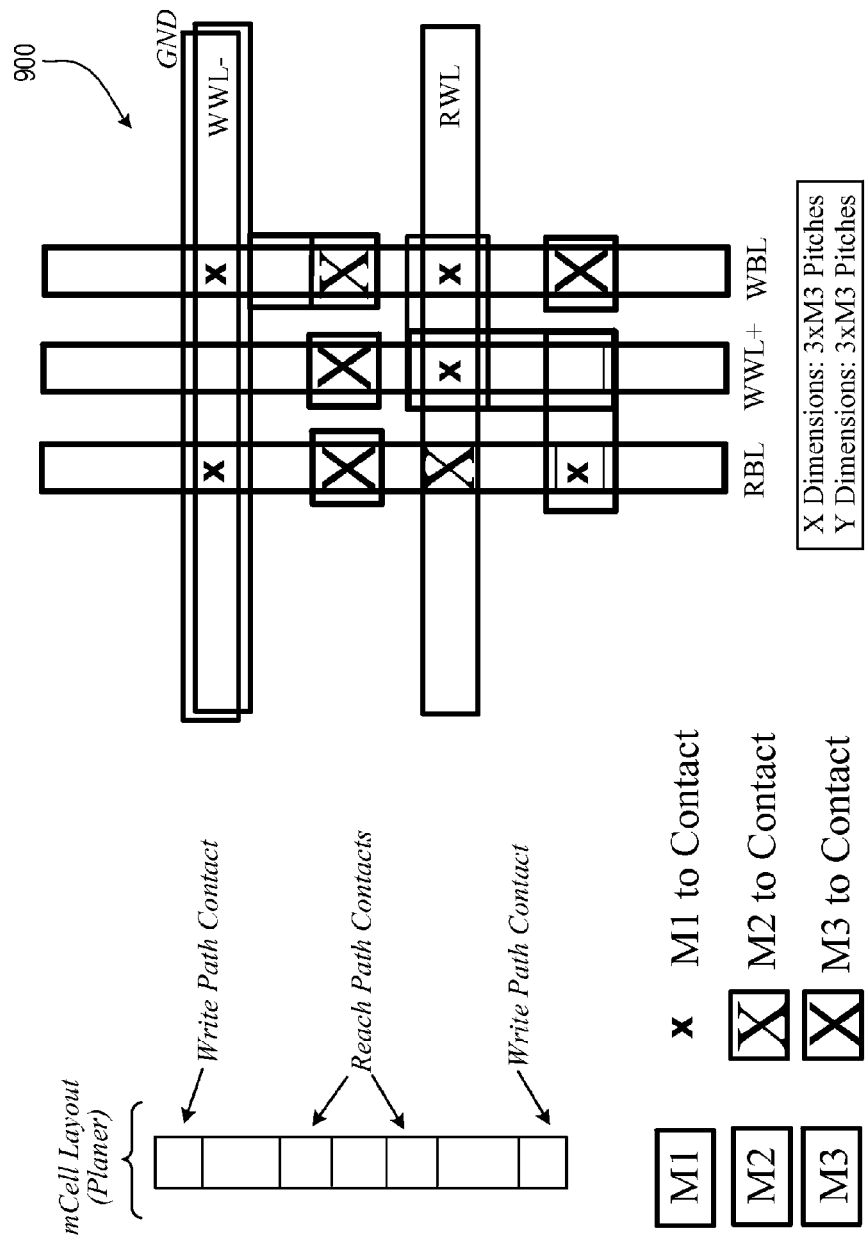
FIG. 9 shows an exemplary planar layout of a bitcell, where the size is limited to three metal pitches by four metal pitches.
Figure 10:
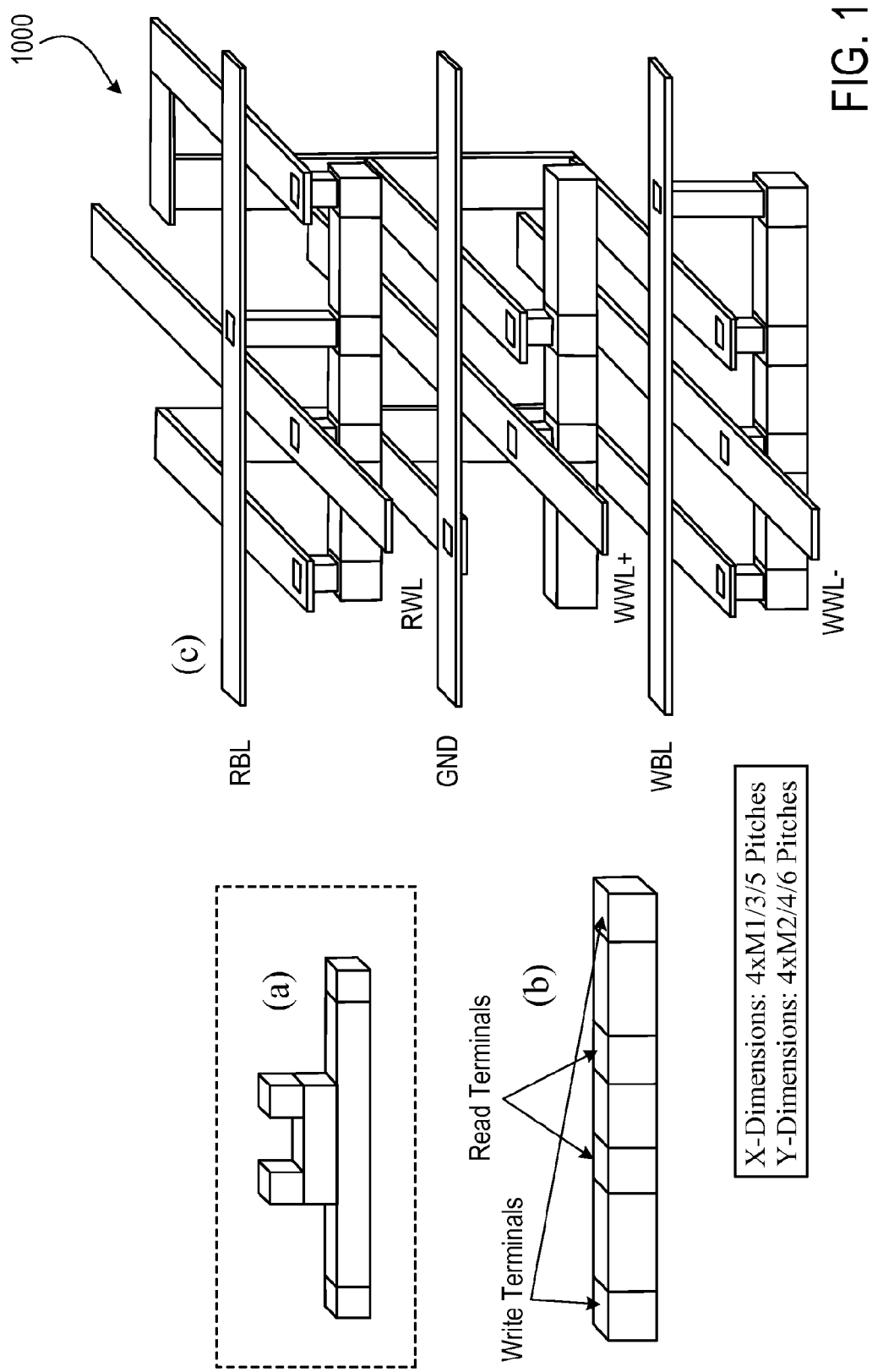
FIG. 10 shows an exemplary 3D-stacked layout of the bitcell, which reduces the lateral dimensions when compared to the planar layout.

In some implementations, because the bitcells consist of all magnetic devices, memory density can be very high compared to other MRAM approaches that require a transistor in every bitcell. For example, referring to FIG. 9, a single planar bitcell layout 900 is shown. In this layout, the size is limited to four metal pitches by three metal pitches. Referring to FIG. 10, mCells 1000 can be stacked, further increasing memory density.

Array periphery elements (i.e., anything not in the bitcell array itself) can be designed using standard CMOS devices. In such implementations, no additional circuitry may be needed. All known memory partitioning styles and hierarchy alternatives, in addition to circuit and layout methods including column-multiplexing and pitch-matching, can still be applicable. Because, in some implementations, no transistors are required in the bitcells, an entire array periphery can be fabricated directly underneath a memory array, which greatly reduces the overall system size when compared to a memory that requires the periphery to be physically placed adjacent to the array. This makes the implementation of an mCell-based high-density, non-volatile commodity memory easier than other approaches that require new CMOS interfaces.

In some implementations, the V+ and V− supply voltages for the magnetic devices can be smaller than those used for conventional CMOS devices, such as 50-100 mV for the mCells, and 1V for the CMOS. This can involve slightly different configurations for the CMOS periphery logic circuits that drive the mCell-based bitcells.

Figure 11:
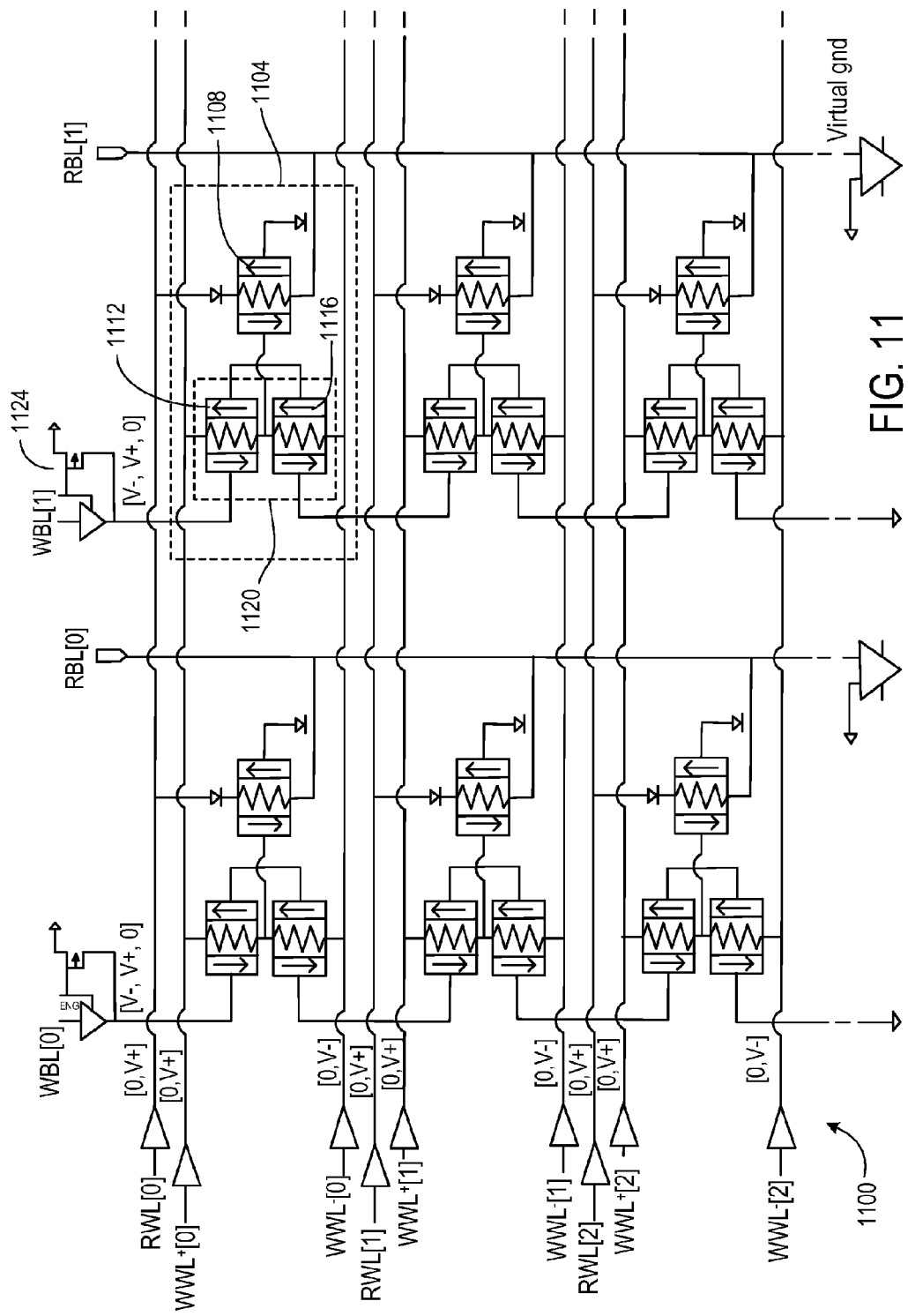
FIG. 11 shows a schematic diagram of a 2×2 exemplary memory array with certain periphery elements shown. A transimpedance amplifier is used to sense the resistance state of the bitcell being read. The bitcell consists of only three magnetic elements, with connections to wordlines and bitlines as shown. The write bitline is driven as a current passing through the series connection of scratch buffer devices. This scheme is also applicable to the two and a half mCell bitcell configuration.

In an implementation, a bitcell for a non-volatile memory array can be constructed using only mCells (e.g., such as mCell 100 of FIG. 1), and no CMOS access transistors. Such a construction would render the MRAM scheme as having all magnetic elements. FIG. 11 shows an all-magnetic memory array 1100, in which each bitcell (e.g., bitcell 1104) uses three mCell devices 1108-1116. In this implementation, a scratch buffer 1120, which consists of mCells 1112 and 1116, is connected to a write bitline (WBL) 1124 in series, such that the logic state of the write bitline (WBL) 1224 is represented by the direction of the current flow through the series connected mCell write path. The WBL current programs the resistance states of mCells 1112 and 1116 in opposite directions, as described in U.S. Pat. No. 8,400,066. As previously noted (see, e.g., the description of bitcell operation regarding FIG. 6), the ratio of the read path resistance of mCell 1116 to the read path resistance of mCell 1112 (in place of the resistive device of FIG. 6) steers a current into or out of the write path terminals of mCell 1108. All scratch buffers connected to a WBL are programmed when a positive or negative current signal is asserted. A direction of the current flowing along the WBL indicates the data bit value to be written to the cell. In other respects, the memory array 1100 operates in a similar manner described above in connection with FIGS. 6-8, and as described in U.S. Pat. No. 8,400,066.

Figure 12:
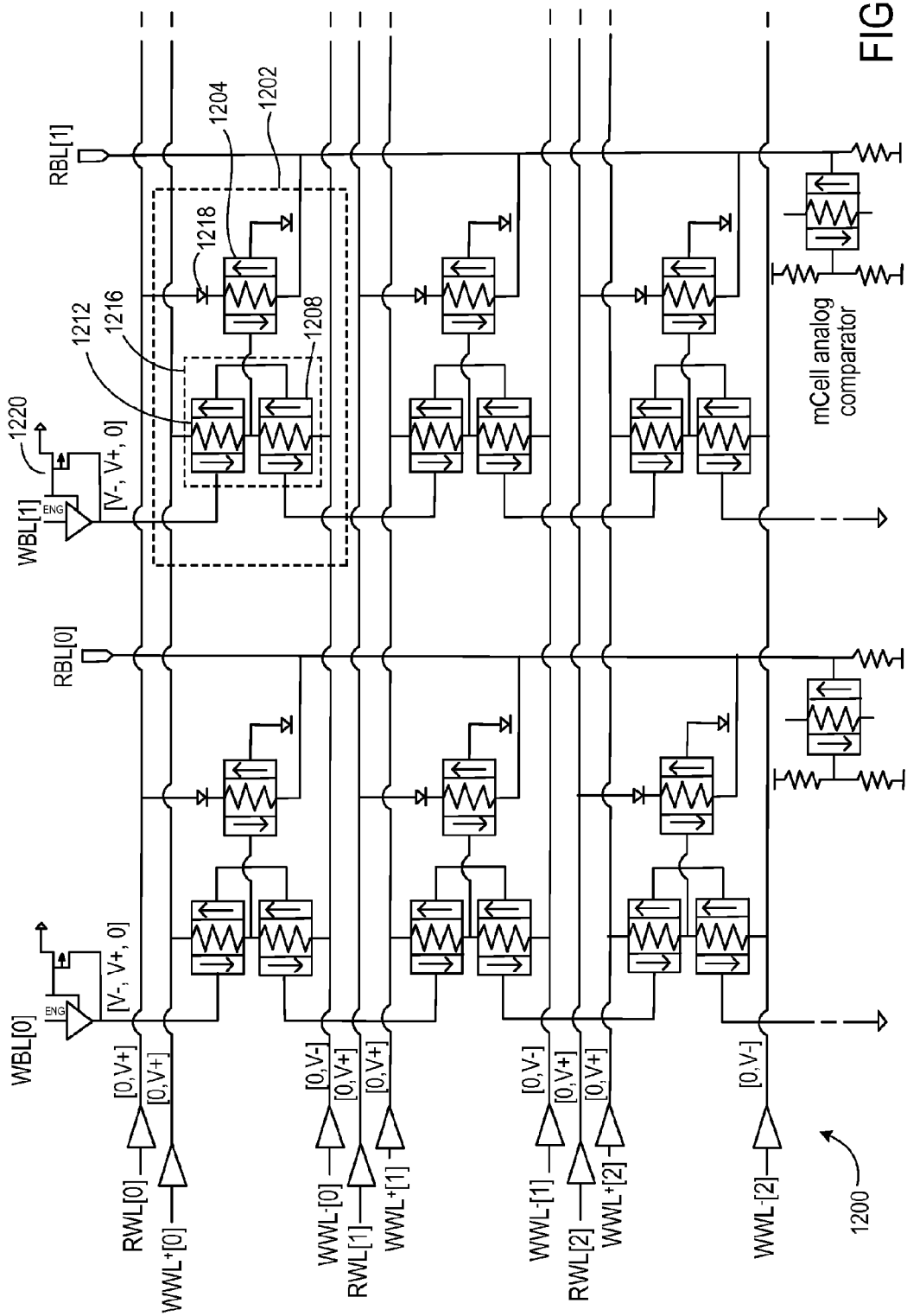
FIG. 12 shows a 2×2 memory array where the bitcells consist of 3 mCells and one diode. This configuration is also compatible with a two and a half mCell bitcell.

FIG. 12 shows an implementation of an all-magnetic memory array 1200 in which a bitcell 1202 includes three mCells 1204-1212 and a diode 1218. As shown, similar to the array in FIG. 11 (array 1100), a scratch buffer 1216, which consists of mCells 1208 and 1212, is connected in series to write bitline (WBL) 1220. Diode 1218 can help in blocking sneak currents that can disturb the stored states of mCells 1204-1212 in the bitcell 1202. The configuration of FIG. 12 can also be applied to a two and one-half mCell bitcell without loss of generality. As shown, a read operation can be performed using resistors and an mCell as an analog comparator 1212.

Figure 13:
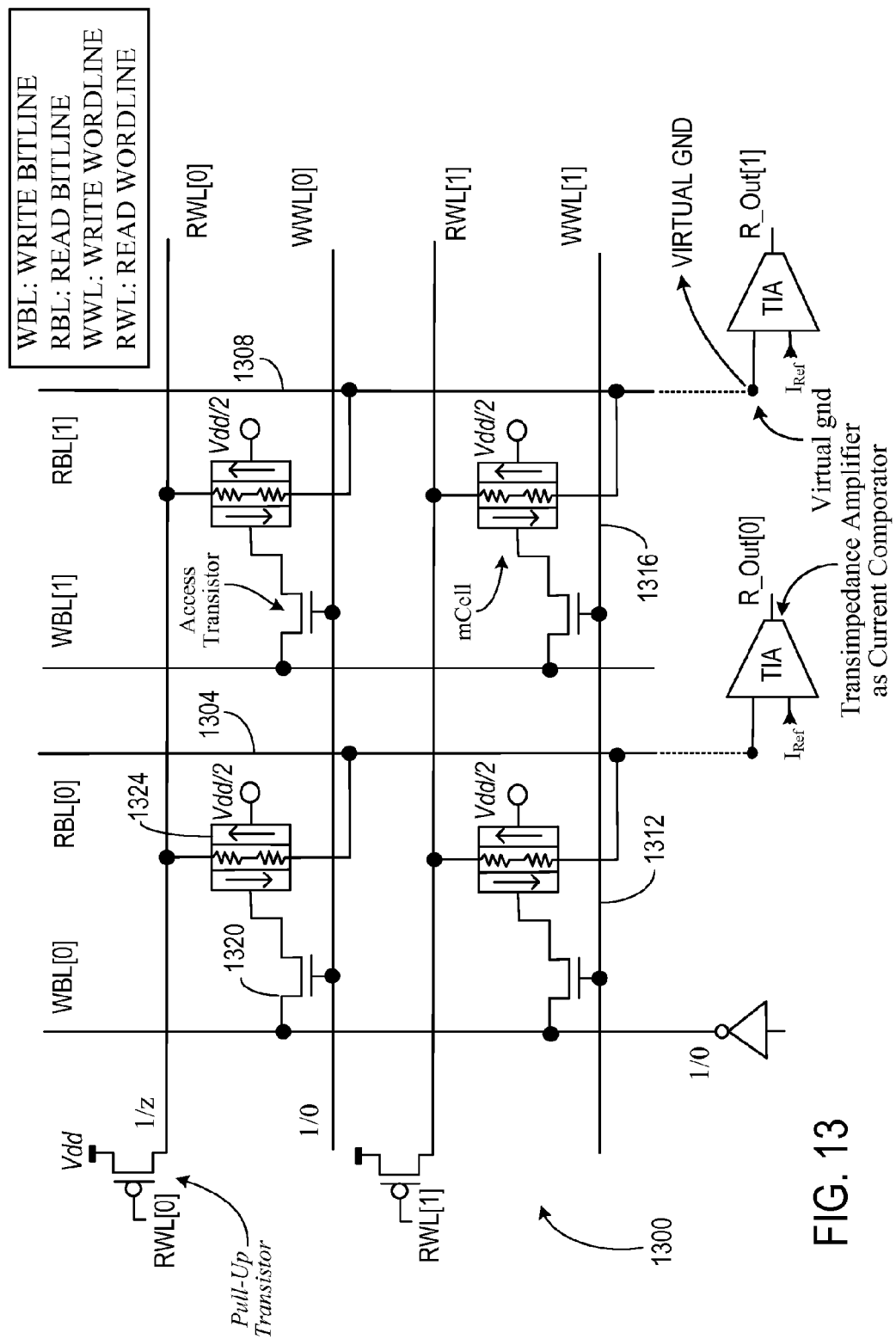
FIG. 13 shows a memory array where the bitcells include transistors.

Referring to FIG. 13, a memory array 1300 can be implemented in which each bitcell 1304-1316 includes a transistor (e.g., CMOS transistor 1320) coupled with an mCell (e.g., mCell 1324). The transistor 1320 performs a function of the buffer (e.g., buffer 614 of FIG. 6) described above. In particular, during a WRITE operation, the transistor 1320 receives a bitline value, a data bit, which is transferred to mCell 1324 for a later READ operation. mCell 1324 receives the data bit from the transistor 1324 during a second half cycle of the WRITE operation as discussed in connection with FIG. 8.

As noted above, mCell 1324 includes a write or programming path and a read or evaluation path. The read path resistance can switch between a first, low resistance state and a second, high resistance state in response to signals magnetically coupled from the write path. In this regard, the write path can be electrically isolated from the read path.

Figure 14:
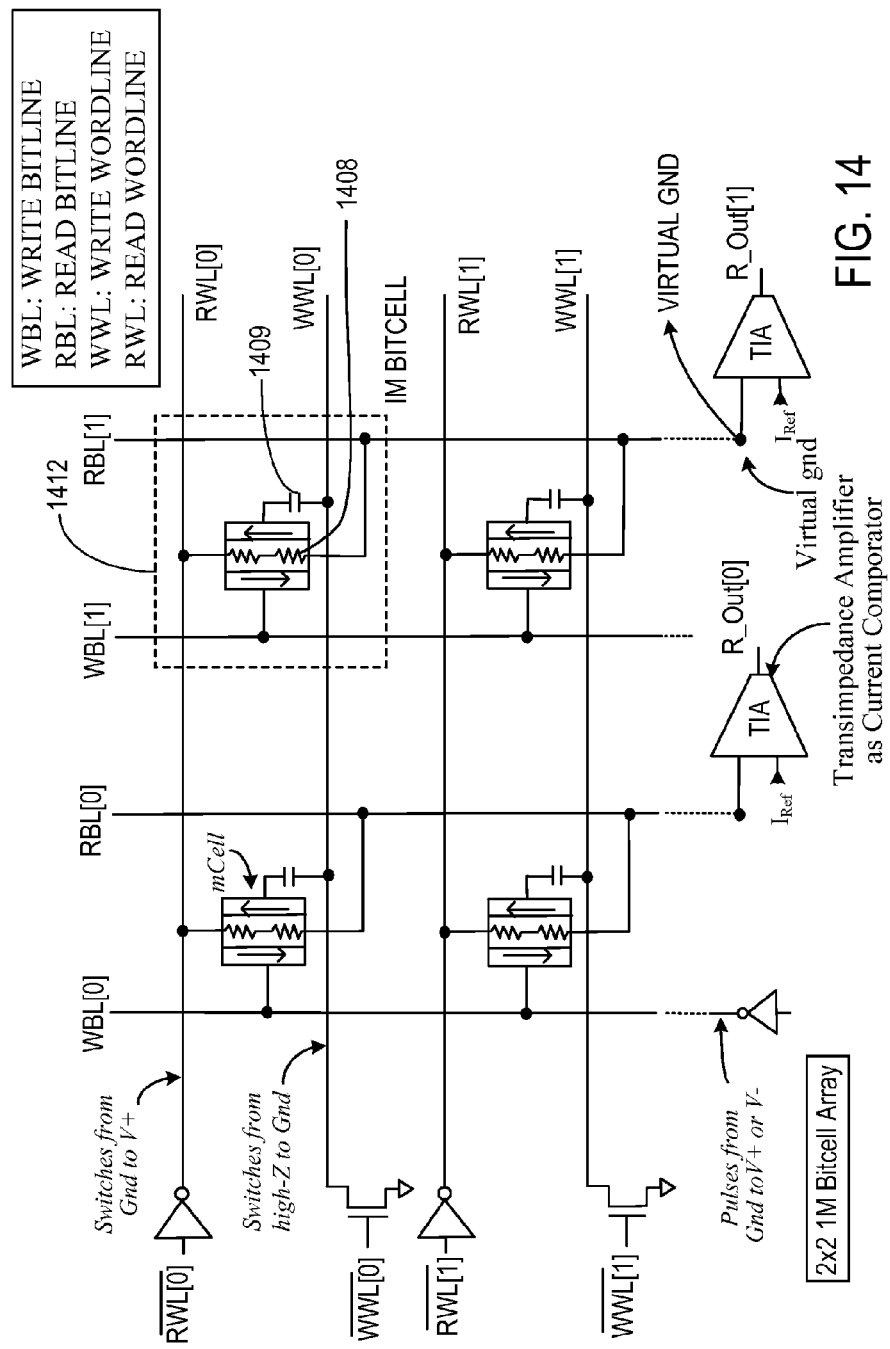
FIG. 14 shows a memory array where the bitcells includes capacitors.
Figure 15:
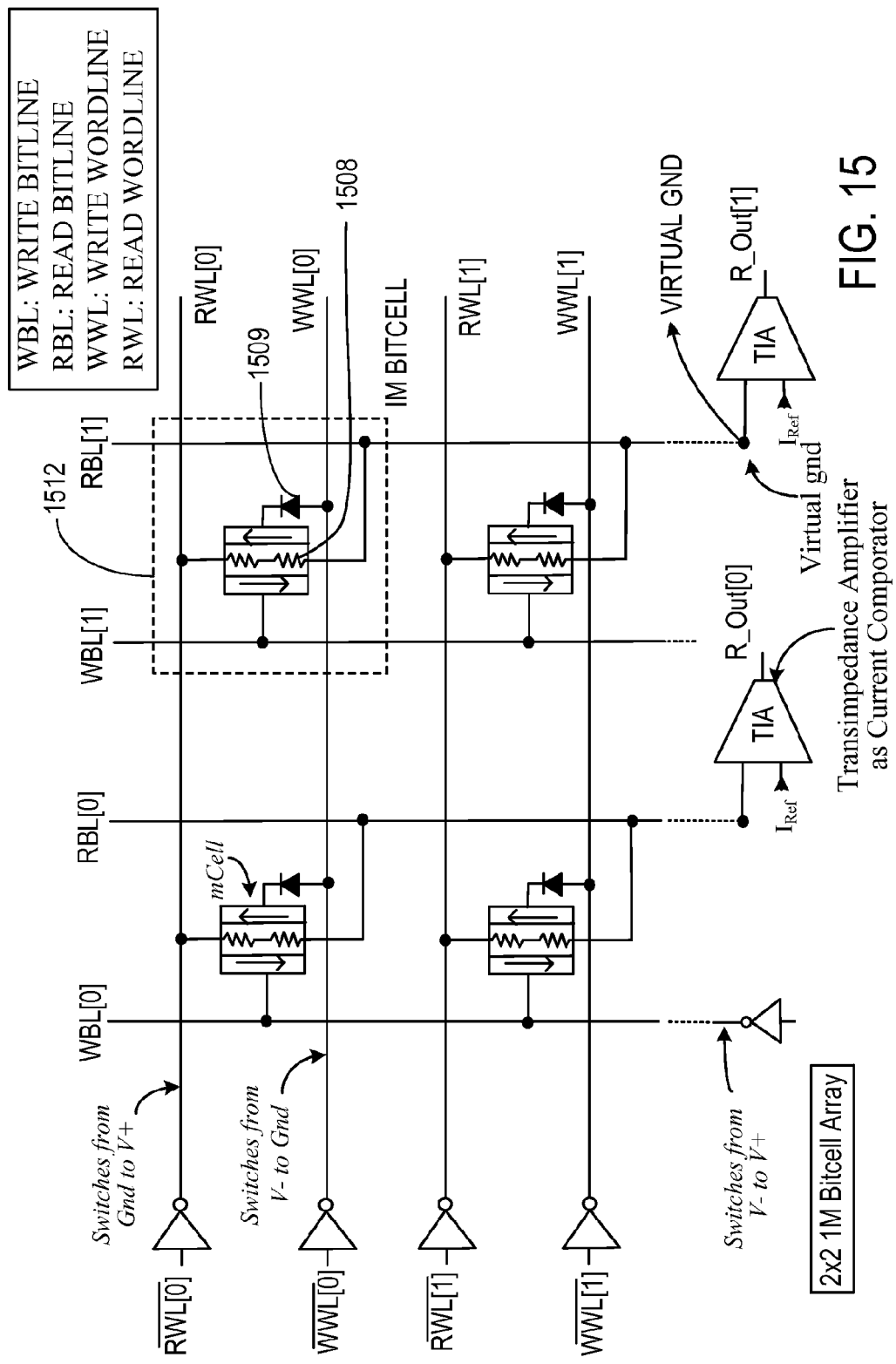
FIG. 15 shows a memory array where the bitcells consist of one mCell and one transistor.

Certain mCell-based memory implementations also offer high density MRAM configurations 1400 and 1500 as shown in FIGS. 14 and 15, where capacitors 1404 and diodes 1504 are coupled to respective mCells 1408, 1508 and integrated into every bitcell 1412, 1512. These extra devices 1404, 1504 can be used to block current "sneak paths" that may disturb the stored states of other mCells in the array. Although these examples require combining mCells with other technologies in every bitcell 1412, 1512, the capacitor 1304 and the diode 1404 can be implemented without requiring connections from every bitcell 1412, 1512 to a CMOS substrate. For example, a diode 1404 can be an effective means of breaking DC coupling among the read paths, thereby avoiding a need to set a read bitline to a virtual ground. This simplifies the read periphery circuit requirements, such that it becomes possible to perform the read function using resistors and an mCell as an analog comparator, such as the one shown in FIG. 12 (see mCell-based analog comparator 1212). In addition, instead of requiring a connection from every bitcell 1512 to a diode 1504 on the silicon substrate, it is possible to deposit materials in a back end of line (BEOL) stack that can be used to form the diode 1504, such as a polysilicon material and a metal to form a Schottky diode.

Other examples are within the scope and spirit of the description and claims. Additionally, certain functions described above can be implemented using software, hardware, firmware, hardwiring, or combinations of any of these. Features implementing functions may also be physically located at various positions, including being distributed such that portions of functions are implemented at different physical locations. The use of the term "a" herein and throughout the application is not used in a limiting manner and therefore is not meant to exclude a multiple meaning or a "one or more" meaning for the term "a." Additionally, to the extent priority is claimed to a provisional patent application, it should be understood that the provisional patent application is not limiting but includes examples of how the techniques described herein may be implemented.

It will thus be seen that the objects set forth above, among those made apparent from the preceding description, are efficiently attained and, because certain changes may be made in carrying out the above method and in the construction(s) set forth without departing from the spirit and scope of the disclosure, it is intended that all matter contained in the above description and shown in the accompanying drawings shall be interpreted as illustrative and not in a limiting sense.

A number of exemplary implementations of the invention have been described. Nevertheless, it will be understood by one of ordinary skill in the art that various modifications may be made without departing from the spirit and scope of the invention.

What is claimed is:

1. A bitcell comprising:
   a first magnetic switching cell to receive a data bit; and
   a buffer comprising a second magnetic switching cell to receive a bitline value,
   wherein the buffer is configured to transfer, in response to a receipt of a signal, the bitline value from the buffer to the first magnetic switching cell as the data bit for a later read operation.

2. The bitcell of claim 1, further comprising a write bitline connected to the buffer for writing the bitline value to the buffer by asserting a predetermined write voltage level on the write bitline.

3. The bitcell of claim 1, further comprising a write bitline connected to the buffer for writing the bitline value to the buffer by causing a current having a predetermined value and a predetermined direction to flow on the write bitline.

4. The bitcell of claim 1, further comprising first and second write wordlines connected to the buffer, the first and second write wordlines effecting a transfer of the bitline value from the buffer to the first magnetic switching cell by asserting first and second predetermined voltage levels on the respective first and second write wordlines.

5. The bitcell of claim 4, wherein the first and second voltage levels correspond to the first and second write wordlines, wherein the first voltage level includes a first predetermined voltage level, wherein the second voltage level includes a second predetermined voltage level, and wherein the first predetermined voltage level has a polarity that is opposite to a polarity of the second predetermined voltage level.

6. The bitcell of claim 1, further comprising a read wordline connected to the first magnetic switching cell for reading the bitline value from the first magnetic switching cell by asserting a predetermined read voltage level on the read wordline.

7. The bitcell of claim 1, further comprising a read bitline connected to the first magnetic switching cell for sensing a current passing through the first magnetic switching cell.

8. The bitcell of claim 1, further comprising a read bitline connected to the first magnetic switching cell for sensing an impedance value of the first magnetic switching cell.

9. The bitcell of claim 1, wherein the buffer includes a third magnetic switching cell connected to the second magnetic switching cell.

10. The bitcell of claim 1, wherein the buffer includes a magnetic tunnel junction based device having a fixed resistance value and connected to the second magnetic switching cell.

11. The bitcell of claim 9, wherein the third magnetic switching cell is switched in a different direction from that of the second switching magnetic cell in the buffer.

12. The bitcell of claim 1, wherein the buffer includes a resistive device connected to the second magnetic switching cell.

13. The bitcell of claim 12, wherein the resistive device comprises a magnetic tunnel junction device.

14. The bitcell of claim 1, wherein at least one of the first and second magnetic switching cells are based on a selected one of a 1) spin-, or 2) spin-orbit, or 3) a combination of spin- and spin-orbit torque principle.

15. The bitcell of claim 1, wherein at least one of the first and second magnetic switching cells are based on a selected one of a 1) spin-transfer torque principle, 2) spin Hall effect, 3) Rashba effect, or 4) combination of spin-transfer torque principle, spin Hall effect, and Rashba effect.

16. The bitcell of claim 1,
wherein an output of the buffer is set to a predetermined ratio of two resistance values; and
wherein a first write bitline connected to the buffer is asserted to a reference voltage, and first and second write wordlines are asserted to predetermined first and second voltage levels, respectively, to cause a current to flow through a write-path of the first magnetic switching cell, a direction of the current determined by the predetermined ratio of the two resistance values.

17. The bitcell of claim 1, further comprising a circuit element for blocking current sneak paths in the bitcell, wherein the circuit element is a selected one of a) a diode, b) a capacitor, or c) a transistor.

18. The bitcell of claim 1, wherein the bitcell is a magnetic bitcell that is independent of a complementary metal-oxide-semiconductor (CMOS) device.

19. A memory device comprising:
at least four bitcells arranged such that each bitcell shares one or more wordlines with another of the four bitcells, and shares one or more bitlines with yet another of the four bitcells;
wherein each bitcell includes:
a first magnetic switching cell to receive a data bit; and
a buffer comprising a second magnetic switching cell to receive a bitline value, the buffer is configured to transfer, in response to a receipt of a signal, the bitline value from the buffer to the first magnetic switching cell as the data bit for a later read operation.

20. The memory device of claim 19, further comprising:
a sensing circuit connected to at least one of the four bitcells to detect the bitline value stored in the corresponding first magnetic switching cell of the bitcell at least by sensing a logical state of the bitcell.

21. The memory device of claim 19, further comprising a sensing circuit that includes a third magnetic switching cell and one or more resistors in connection with the third magnetic switching cell.

22. The memory device of claim 19, wherein a write bitline connects a first buffer of a first bitcell in series with a second buffer of a second bitcell within the memory device.

23. The memory device of claim 22, wherein the write bitline connects magnetic switching cells of the first and second buffers in series such that a logical state of the write bitline is represented by a current flowing through write-paths of the first and second magnetic switching cells.

24. A bitcell comprising:
a magnetic switching cell to receive a data bit, the magnetic switching cell including a programming path, and an evaluation path whose resistance can switch between a first resistance state and a second resistance state, the first resistance state being lower than the second resistance state, in response to signals magnetically coupled from the programming path, the programming path being electrically isolated from the evaluation path; and
a buffer comprising at least a transistor to receive a bitline value, wherein the buffer is configured to transfer, in response to a receipt of a signal, the bitline value from the buffer to the magnetic switching cell as the data bit for a later read operation.

25. The bitcell of claim 24, wherein the magnetic switching cell is based on a selected one of a 1) spin-, or 2) spin-orbit, or 3) a combination of spin- and spin-orbit torque principle.

26. The bitcell of claim 24, wherein the magnetic switching cell is based on a selected one of a 1) spin-transfer torque principle, 2) spin Hall effect, 3) Rashba effect, or 4) combination of spin-transfer torque principle, spin Hall effect, and Rashba effect.

27. A method comprising:
receiving a data bit value at a buffer in a bitcell based on a first state of a write bitline connected to the buffer, and
in response to a receipt of a signal, transferring the data bit value from the buffer to a first magnetic switching cell in the bitcell for a later read operation at least by:
holding the write bitline to a reference value different from the first state, and
asserting first and second predetermined voltage levels on respective first and second write wordlines connected to the buffer.

28. The method of claim 27, wherein receiving a data bit value at a buffer comprises storing the data bit value in a second magnetic switching cell in the buffer.

29. The method of claim 27, further comprising:
asserting a predetermined read voltage level on a read wordline connected to the first magnetic switching cell, and
sensing a current passing through the first magnetic switching cell on a read bitline connected to the first magnetic switching cell.

* * * * *